(12) United States Patent
Xiao (10) Patent No.: US 10,827,276 B2
(45) Date of Patent: Nov. 3, 2020

(54) MICRO-SPEAKER

(71) Applicant: AAC Technologies Pte. Ltd., Singapore (SG)

(72) Inventor: Bo Xiao, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/528,690

(22) Filed: Aug. 1, 2019

(65) Prior Publication Data

US 2020/0053476 A1 Feb. 13, 2020

(30) Foreign Application Priority Data

Aug. 8, 2018 (CN) ..................... 2018 2 1277880 U (51) Int. Cl.
| | |
|---|---|
| *H04R 9/06* | (2006.01) |
| *H05K 1/02* | (2006.01) |
| *H05K 1/11* | (2006.01) |
| *H05K 1/18* | (2006.01) |
| *H01F 7/08* | (2006.01) |
| *H04R 7/18* | (2006.01) |
| *H04R 3/00* | (2006.01) |
| *H04R 9/02* | (2006.01) |
| *H04R 1/06* | (2006.01) |
| *H04R 7/12* | (2006.01) |

(52) U.S. Cl.
CPC ............... *H04R 9/06* (2013.01); *H01F 7/081* (2013.01); *H04R 1/06* (2013.01); *H04R 3/00* (2013.01); *H04R 7/18* (2013.01); *H04R 9/025* (2013.01); *H05K 1/0277* (2013.01); *H05K 1/111* (2013.01); *H05K 1/181* (2013.01); *H04R 7/127* (2013.01); *H04R 2499/11* (2013.01); *H05K 2201/10083* (2013.01)

(58) Field of Classification Search
CPC . H04R 3/00; H04R 9/06; H04R 9/025; H04R 1/06; H04R 2499/11; H04R 7/18; H04R 7/127; H01F 7/081; H05K 1/0277; H05K 1/111; H05K 1/181; H05K 2201/10083
USPC ........................................................ 381/117
See application file for complete search history.

(56) References Cited

U.S. PATENT DOCUMENTS 10,250,993 B1 * 4/2019 Xiao ...................... H04R 9/025

* cited by examiner

*Primary Examiner* — Paul Kim
(74) *Attorney, Agent, or Firm* — W&G Law Group LLP (57) ABSTRACT

A micro-speaker is provided, including: a vibration unit and a fixed unit. The vibration unit includes a diaphragm, a voice coil located below the diaphragm and driving the diaphragm to vibrate and emit sound, and a flexible circuit board connected to the voice coil. The diaphragm and the flexible circuit board are fixed to the fixed unit. The voice coil includes a body and a lead wire extending from the body. A pad is formed on the flexible circuit board, and includes a base and a plating layer formed on the base. The plating layer includes a first plating layer and a second plating layer extending from the first plating layer. The first plating layer has a greater thickness than the second plating layer. An end of the lead wire away from the body is welded to the pad and covered by the second plating layer.

5 Claims, 12 Drawing Sheets

MICRO-SPEAKER

TECHNICAL FIELD

The present disclosure relates to the field of electric-acoustic conversion technologies, and in particular, to a micro-speaker.

BACKGROUND

In order to adapt to the development of miniaturization and multi-functionalization of various audio equipment and information communication equipment, it is required that the micro-speakers used in such equipment further tend to miniaturization, so that the micro-speakers and other peripheral components are more compact. In particular, with the development of thin and light mobile phones, quality requirements for the micro-speakers used therein are also increasing.

A micro-speaker includes a vibration unit in which a voice coil is electrically connected to an external circuit through a flexible circuit board. However, in the related art, a plating layer of a pad on the flexible circuit board for use in spot welding for a lead wire of the voice coil has a same thickness. The spot welding for the lead wire of the voice coil includes the following steps:

Step 1 of penetrating an insulation layer of the lead wire of the voice coil; and Step 2 of covering the lead wire of the voice coil by the plating layer.

Step 1 requires the plating layer to be thin, while Step 2 requires the plating layer to be thick. The existing level of the plating layer cannot perfectly meet the requirements of Steps 1 and 2, and thus there is a risk of pseudo welding for the lead wire of the voice coil.

Therefore, it is necessary to provide a new micro-speaker to solve the above problems.

BRIEF DESCRIPTION OF DRAWINGS

Many aspects of the exemplary embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

The present disclosure will be further illustrated with reference to the accompanying drawings and the embodiments.

Embodiment 1

As shown in FIGS. 1 to 7, a micro-speaker 100 includes a fixed unit 1 and a vibration unit 3. The fixed unit 1 includes a holder 5 having a receiving space and a magnetic circuit unit 7. The vibration unit 3 and the magnetic circuit unit 7 are received in the holder 5. The magnetic circuit unit 7 drives the vibration unit 3 to vibrate and emit sound.

The vibration unit 3 includes a diaphragm 31, a voice coil 32 located below the diaphragm 31 and driving the diaphragm 31 to vibrate and emit sound, and a flexible circuit board 33 connected to the voice coil 32. The diaphragm 31 and the flexible circuit board 33 are fixed to the holder 5 of the fixed unit 1. The voice coil 32 is connected to an external circuit through the flexible circuit board 33. After the voice coil 32 is energized, the voice coil 32 may vibrate under the magnetic field of the magnetic circuit unit 7. Meanwhile, the voice coil 32 drives the diaphragm 31 to vibrate and emit sound.

The voice coil 32 includes a body 321 and a lead wire 323 extending from the body 321.

Figure 7:
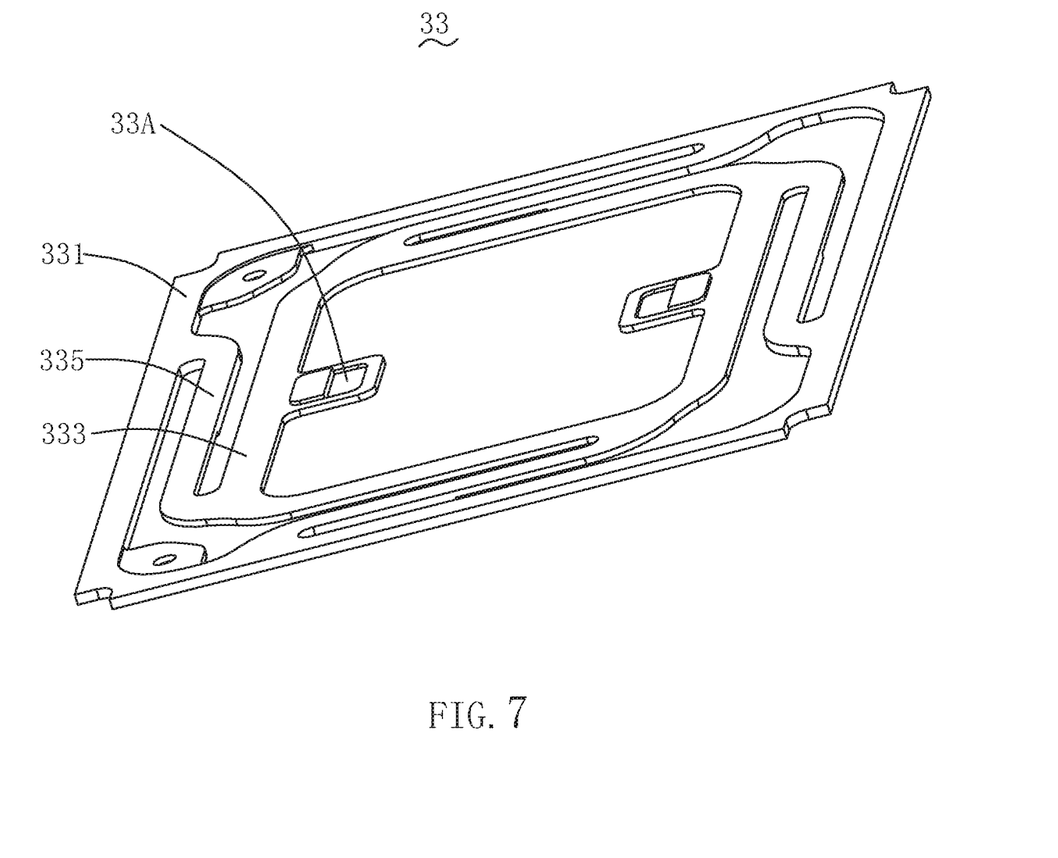
FIG. 7 is a structural schematic diagram of a flexible circuit board in the partial structure shown in FIG. 5.

A pad 33A welded to the lead wire 323 is formed on the flexible circuit board 33.

The pad 33A includes a base 33B and a plating layer 33C formed on the base 33B. The plating layer 33C includes a first plating layer 33D and a second plating layer 33E extending from the first plating layer 33D. The first plating layer 33D has a greater thickness than the second plating layer 33E. One end of the lead wire 323 facing away from the body 321 is welded to the pad 33A and covered by the second plating layer 33E.

In this embodiment, the first plating layer 33D is closer to the body 321 with respect to the second plating layer 33E.

In this embodiment, orthographic projections of the first plating layer 33D and the second plating layer 33E on the base 33B have equal areas.

In this embodiment, the first plating layer 33D and the second plating layer 33E are provided at a side of the base 33B facing the voice coil 32.

Figure 3:
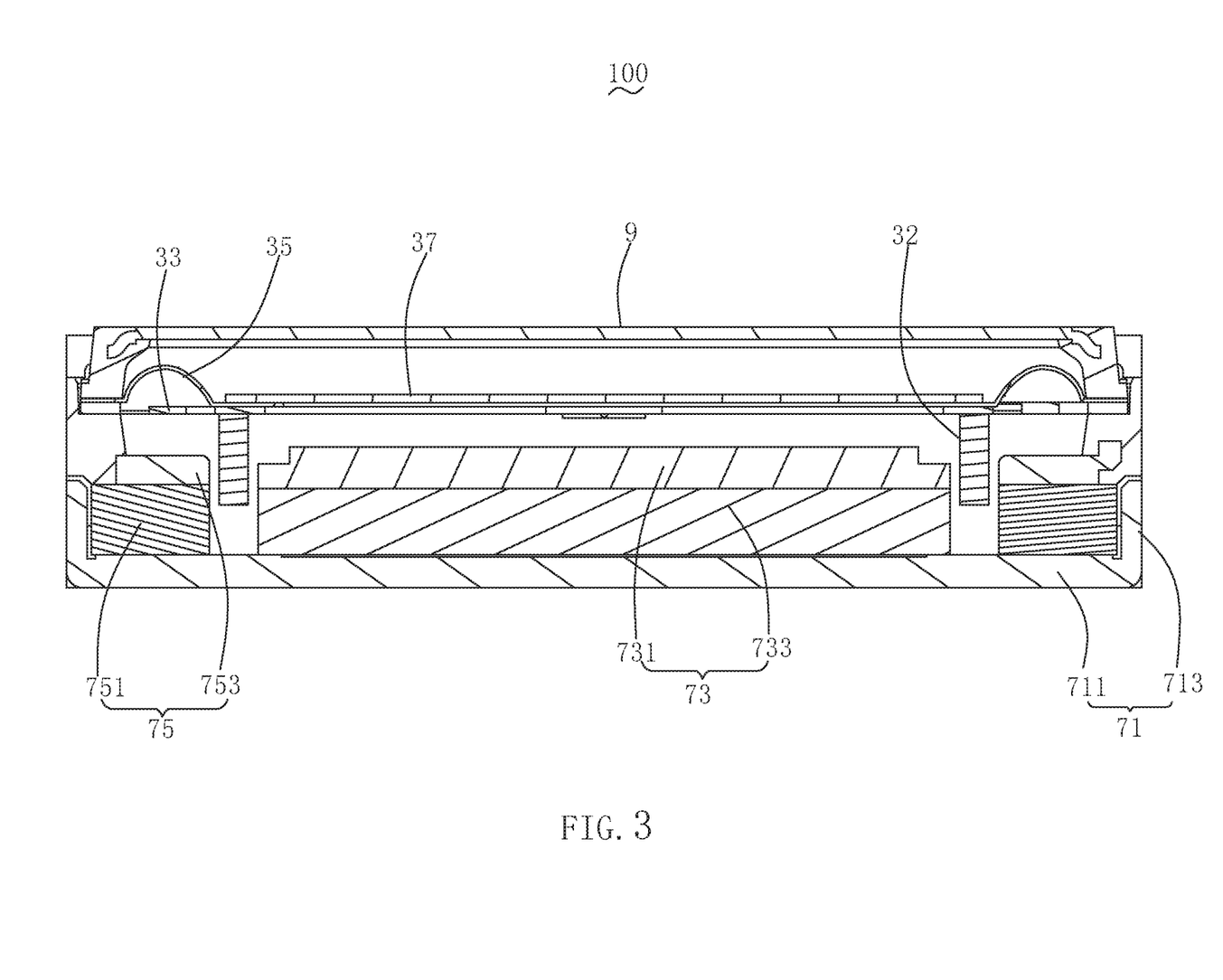
FIG. 3 is a cross-sectional view of the micro-speaker shown in FIG. 2 taken along line A-A.
Figure 4:
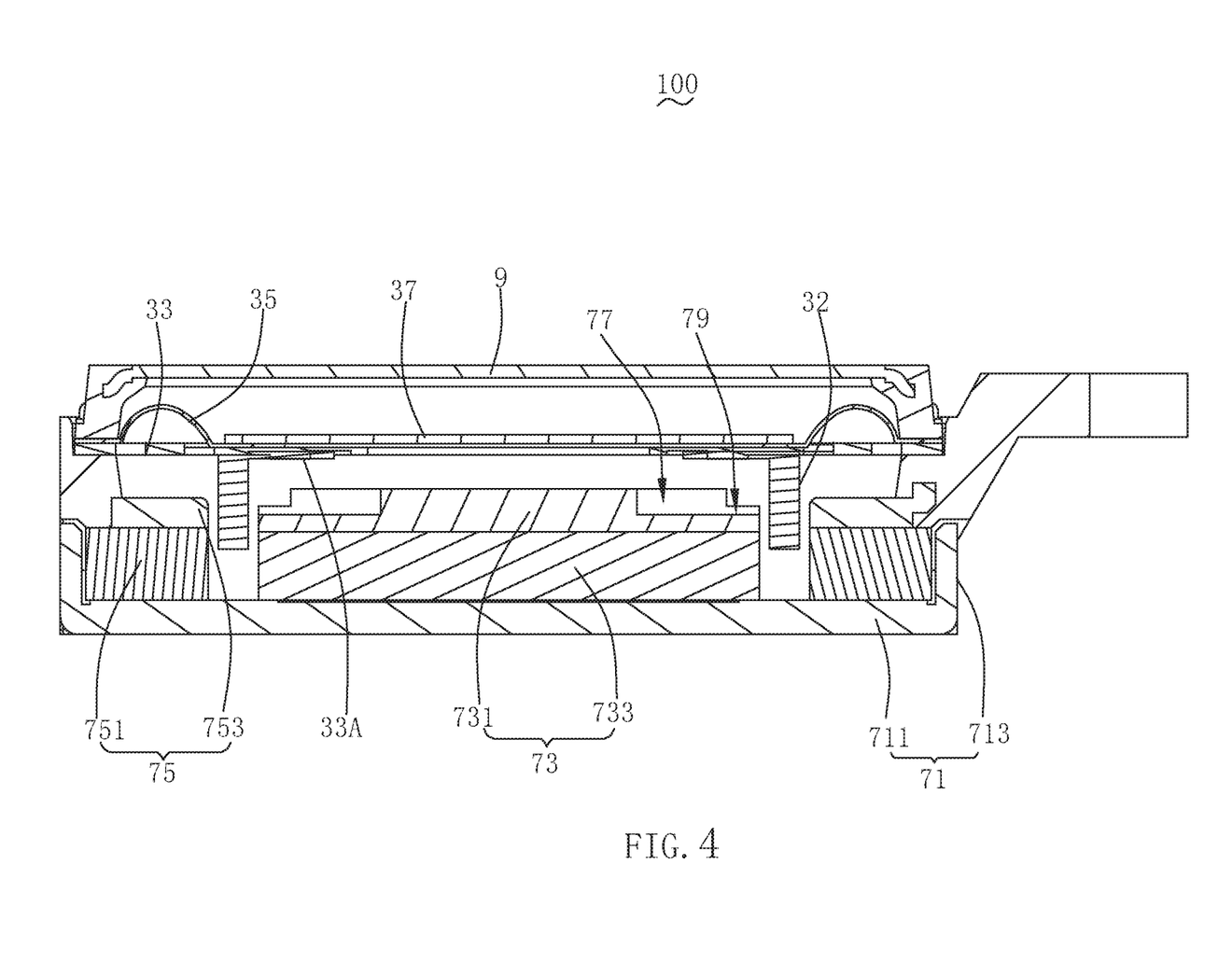
FIG. 4 is a cross-sectional view of the micro-speaker shown in FIG. 2 taken along line B-B.
Figure 5:
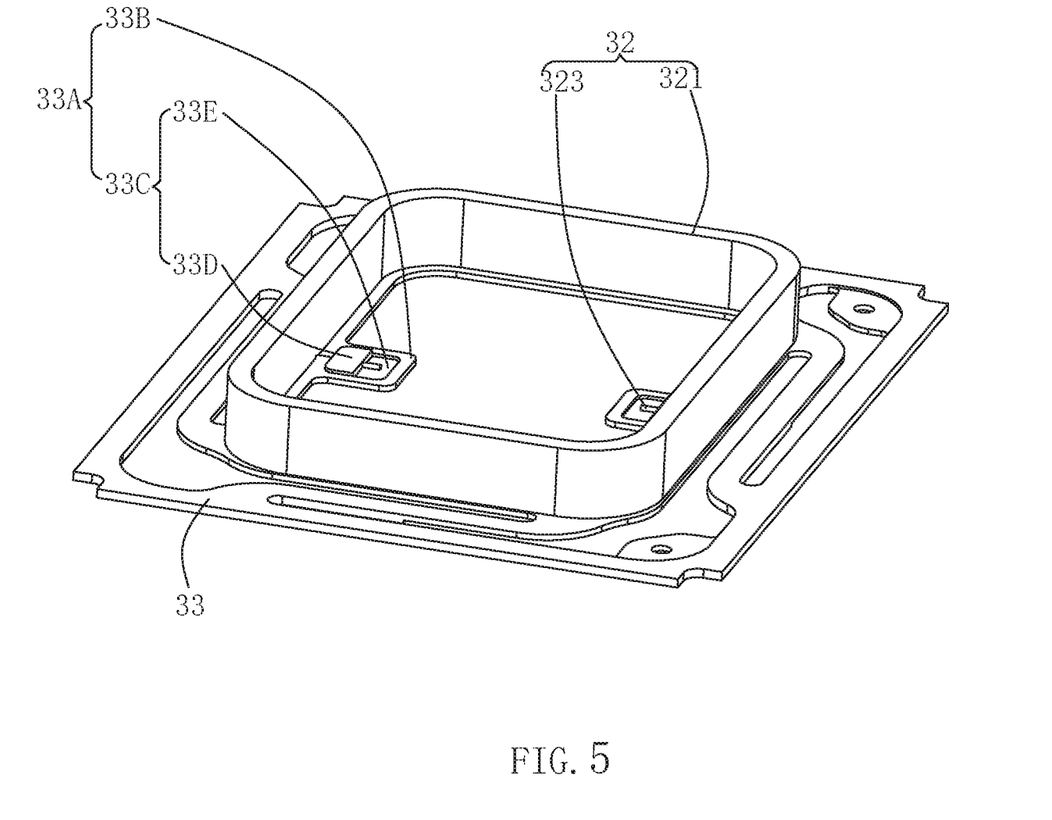
FIG. 5 is a perspective view of the micro-speaker shown in FIG. 1 after its partial structure being assembled.
Figure 6:
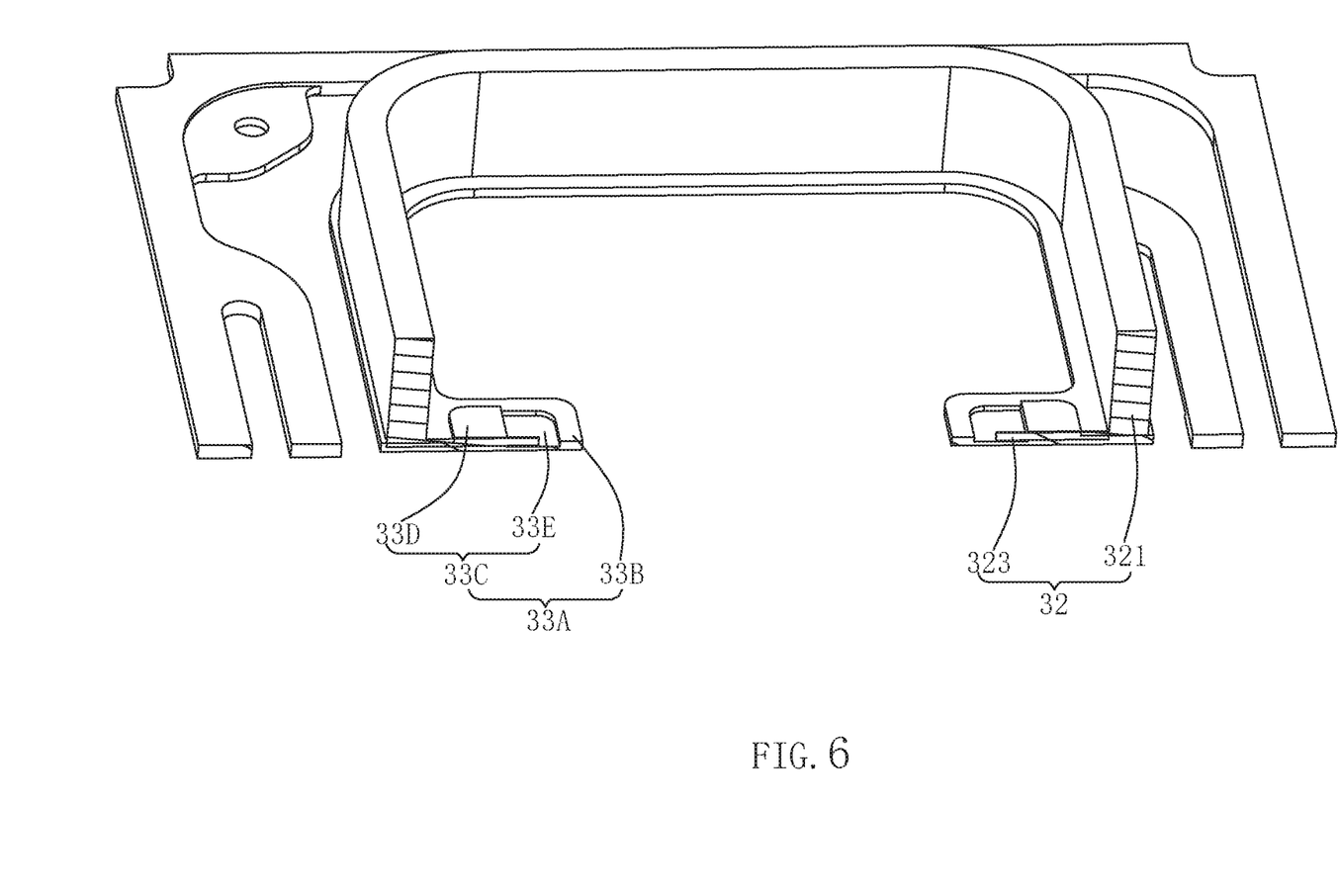
FIG. 6 is a cross-sectional view of the partial structure shown in FIG. 5.

The flexible circuit board 33 is sandwiched between the voice coil 32 and the diaphragm 31. After the voice coil 32 is energized, the flexible circuit board 33 vibrates together with the voice coil 32. For example, the flexible circuit board 33 is sandwiched between the body 321 of the voice coil 32 and the diaphragm 31.

In this embodiment, the flexible circuit board 33 includes a first fixed portion 331 fixed to the holder 5 of the fixed unit 1, a second fixed portion 333 connected to the body 321, and an elastic connection portion 335 connecting the first fixed portion 331 with the second fixed portion 333. The pad 33A is formed on the second fixed portion 333.

Each of the first fixed portion 331 and the second fixed portion 333 is in a ring structure.

The second fixed portion 333 generally has a rectangular structure. In one embodiment, the pad 33A is located on the long axis side of the second fixed portion 333, and the pad 33A extends from the second fixed portion 333 in a direction facing away from the first fixed portion 331.

Figure 1:
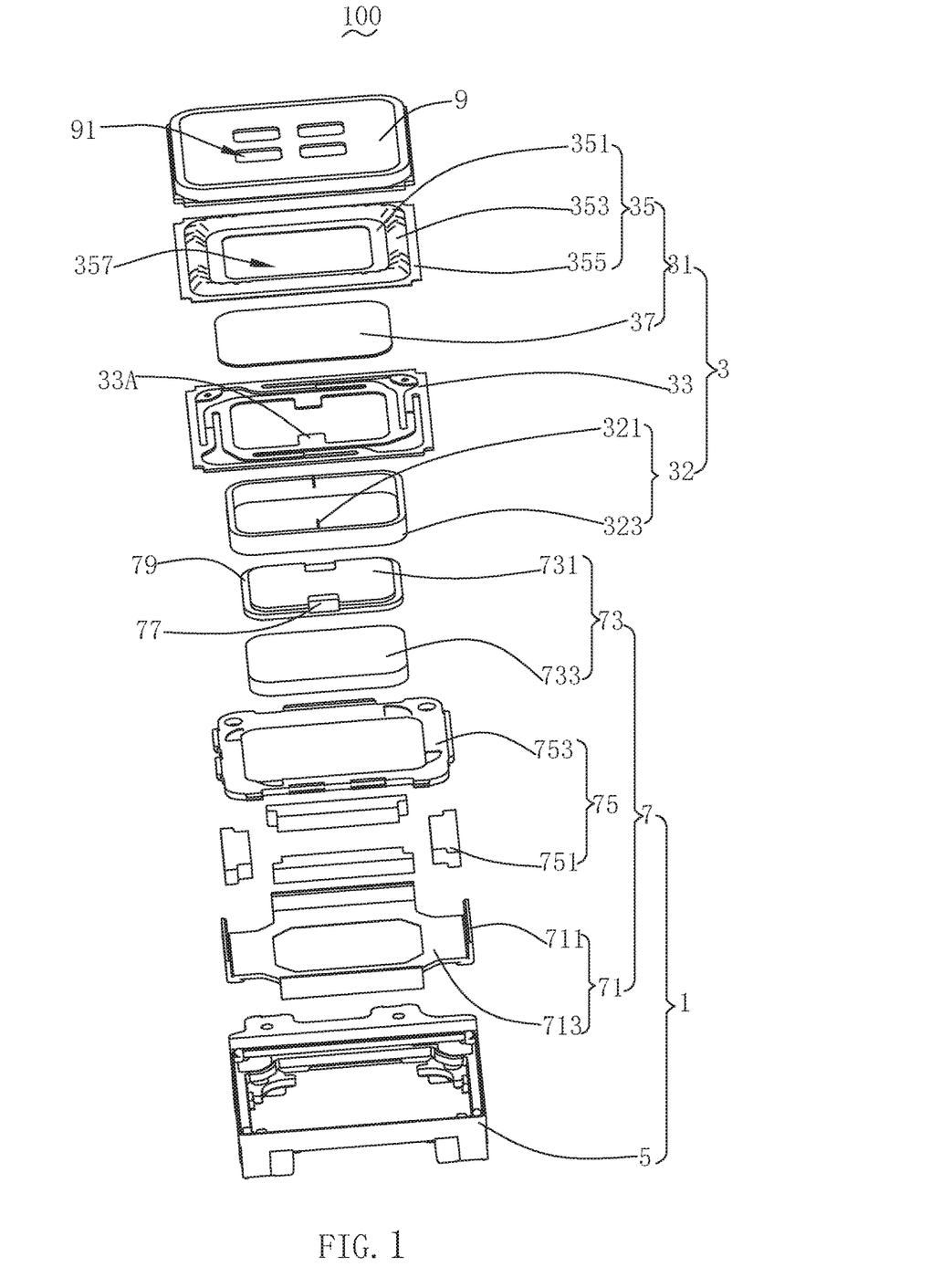
FIG. 1 is a perspective exploded view of a micro-speaker according to an embodiment of the present disclosure.
Figure 2:
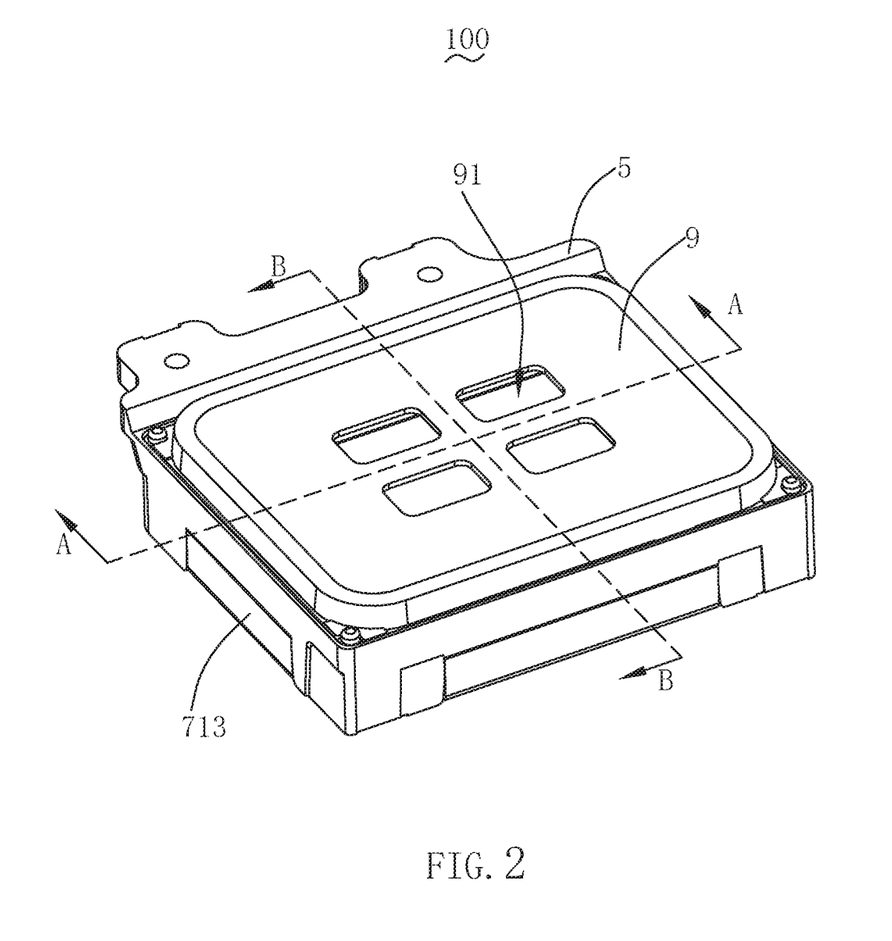
FIG. 2 is a perspective view of the micro-speaker shown in FIG. 1 after being assembled.

The diaphragm 31 includes a voice membrane 35 and a dome 37 fixed to a side of the voice membrane 35 facing away from the voice coil 32.

The voice membrane 35 includes a flat portion 351, a suspension portion 353 extending outward from the flat portion 351, and a joint portion 355 surrounding the suspension portion 353. The flat portion 351 is sandwiched between the second fixed portion 333 of the flexible circuit board 33 and the dome 37. The suspension portion 353 opens toward the flexible circuit board 33 to avoid the elastic connection portion 335. The joint portion 355 is fixed to the first fixed portion 331 of the flexible circuit board 33, so that the diaphragm 31 and the flexible circuit board 33 are fixed to the holder 5 of the fixed unit 1. As shown in FIG. 1, the flat portion 351 has a center-cut hole 357. The dome 37 covers the center-cut hole 357. In other embodiments of the diaphragm 31, the flat portion 351 may not have a center-cut hole, that is, the flat portion 351 is an intact flat plate structure. In one embodiment, the dome 37 is sandwiched between the flat portion 351 and the second fixed portion 333 of the flexible circuit board 33. In one embodiment, in the case where the flat portion 351 is an intact flat plate structure, the diaphragm 31 may not include a dome. The second fixed portion 333 of the flexible circuit board 33 is sandwiched between the flat portion 351 and the body 321 of the voice coil 32.

The magnetic circuit unit 7 includes a yoke 71, a first magnet portion 73, and a second magnet portion 75. The yoke 71 is fixedly held at the holder 5. The first magnet portion 73 and the second magnet a portion 75 are fixed to the yoke 71. The second magnet portion 75 is provided to surround the first magnet portion 73 and forms a magnetic gap with the first magnet portion 73. One end of the body 321 of the voice coil 32 is inserted into the magnetic gap so that the voice coil 32 may vibrate under the action of the magnetic field of the magnetic circuit unit 7 after the voice coil 32 is energized.

The yoke 71 includes a bottom plate 711, side plates 713 formed by bending from four sides of the bottom plate 711 toward the diaphragm 31. The first magnet portion 73 and the second magnet portion 75 are fixed to the bottom plate 711. The side plate 713 is fixed to the holder 5.

The first magnet portion 73 faces right towards the diaphragm 31. The first magnet portion 73 is recessed to form an avoiding portion 77 corresponding to the pad 33A. The avoiding portion 77 is formed by recessing from a surface of the first magnet portion 73 facing the diaphragm 31 along a direction facing away from the diaphragm 31. In this embodiment, since the orthographic projection of the second fixed portion 333 along the vibration direction of the diaphragm 31 falls on the first magnet portion 73, the first magnet portion 73 is further recessed to form a give-way portion 79 avoiding the loop of the second fixed portion 333, in order to avoid the collision between the second fixed portion 333 of the flexible circuit board 33 and the first magnet portion 73 when the flexible circuit board 33 vibrates together with the voice coil 32.

The first magnet portion 73 includes a pole plate 731 and a main magnet 733. The pole plate 731 faces right towards the diaphragm 31. The main magnet 733 is sandwiched between the pole plate 731 and the bottom plate 711 of the yoke 71. The avoiding portion 77 and the give-way portion 79 are formed on the pole plate 731.

The second magnet portion 75 includes an auxiliary magnet 751 and a splint 753. The auxiliary magnet 751 is fixed to the bottom plate 711 and surrounds the main magnet 733. The splint 753 is fixedly held at the holder 5, and is stacked on the auxiliary magnet 751. The splint 753 is made of a permeability material. The splint 753 has a through hole. The pole plate 731 is located in the through hole of the splint 753 and is in a same plane as the splint 753.

The micro-speaker 100 further includes a cover 9 covering the holder 5. The cover 9 is provided with a voice outlet 91. The voice outlet 91 is used as a channel for outputting the sound generated by vibration of the diaphragm 31.

Embodiment 2

Shown in FIGS. 8 to 12, the micro-speaker 200 includes a fixed unit 1' and a vibration unit 3'. The fixed unit 1' includes a holder 5' having a receiving space and a magnetic circuit unit 7'. The vibration unit 3' and the magnetic circuit unit 7' are received in the holder 5'. The magnetic circuit unit 7' drives the vibration unit 3' to vibrate and emit sound.

The vibration unit 3' includes a diaphragm 31', a voice coil 32' located below the diaphragm 31' and driving the diaphragm 31' to vibrate and emit sound, and a flexible circuit board 33' connected to the voice coil 32'. The diaphragm 31' and the flexible circuit board 33' are fixed to the holder 5' of the fixed unit 1'. The voice coil 32' is connected to an external circuit through the flexible circuit board 33'. After the voice coil 32' is energized, the voice coil 32' may vibrate under the magnetic field of the magnetic circuit unit 7'. Meanwhile, the voice coil 32' drives the diaphragm 31' to vibrate and emit sound.

Figure 8:
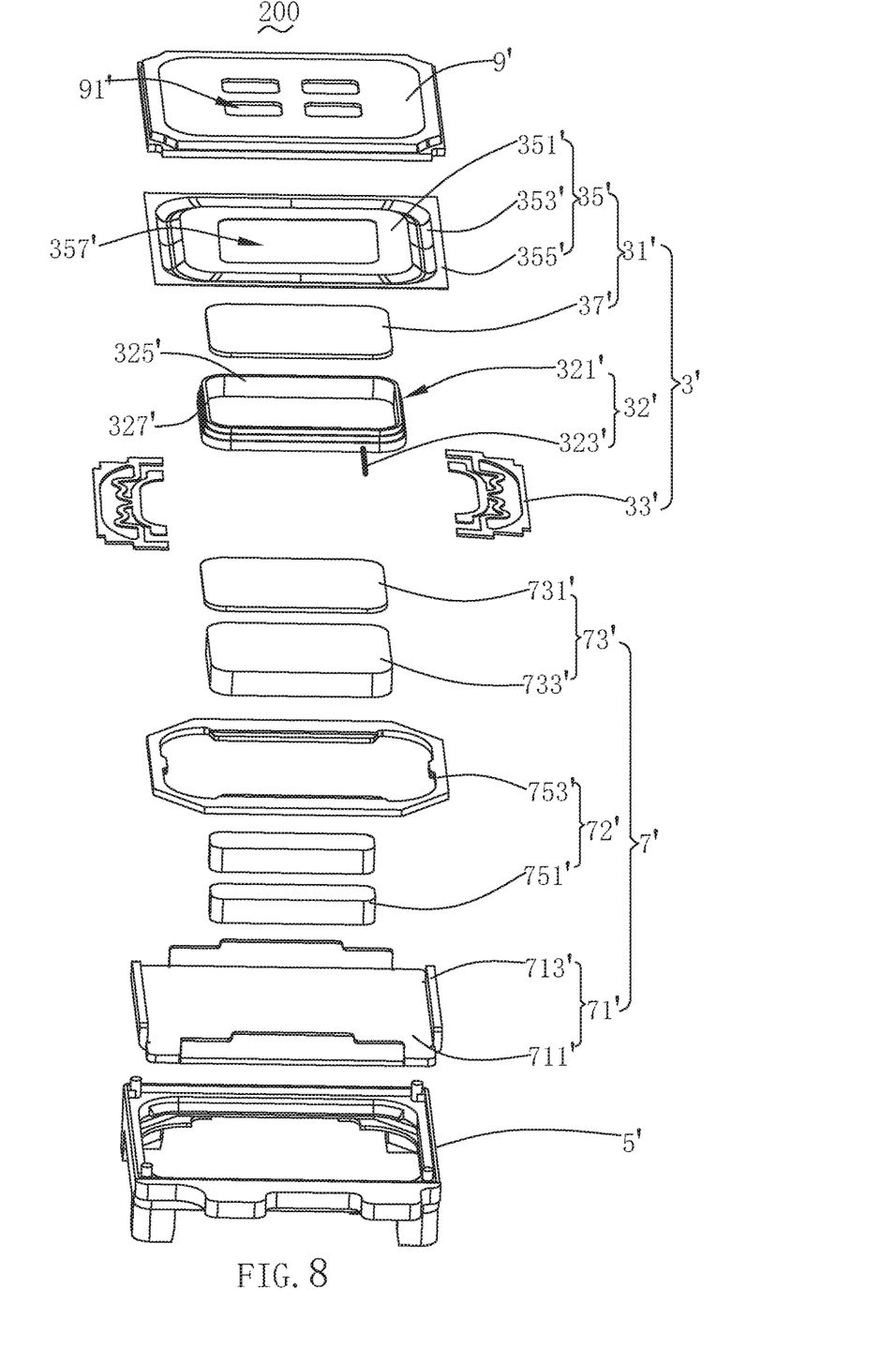
FIG. 8 is a perspective exploded view showing a micro-speaker according to another embodiment of the present disclosure.
Figure 9:
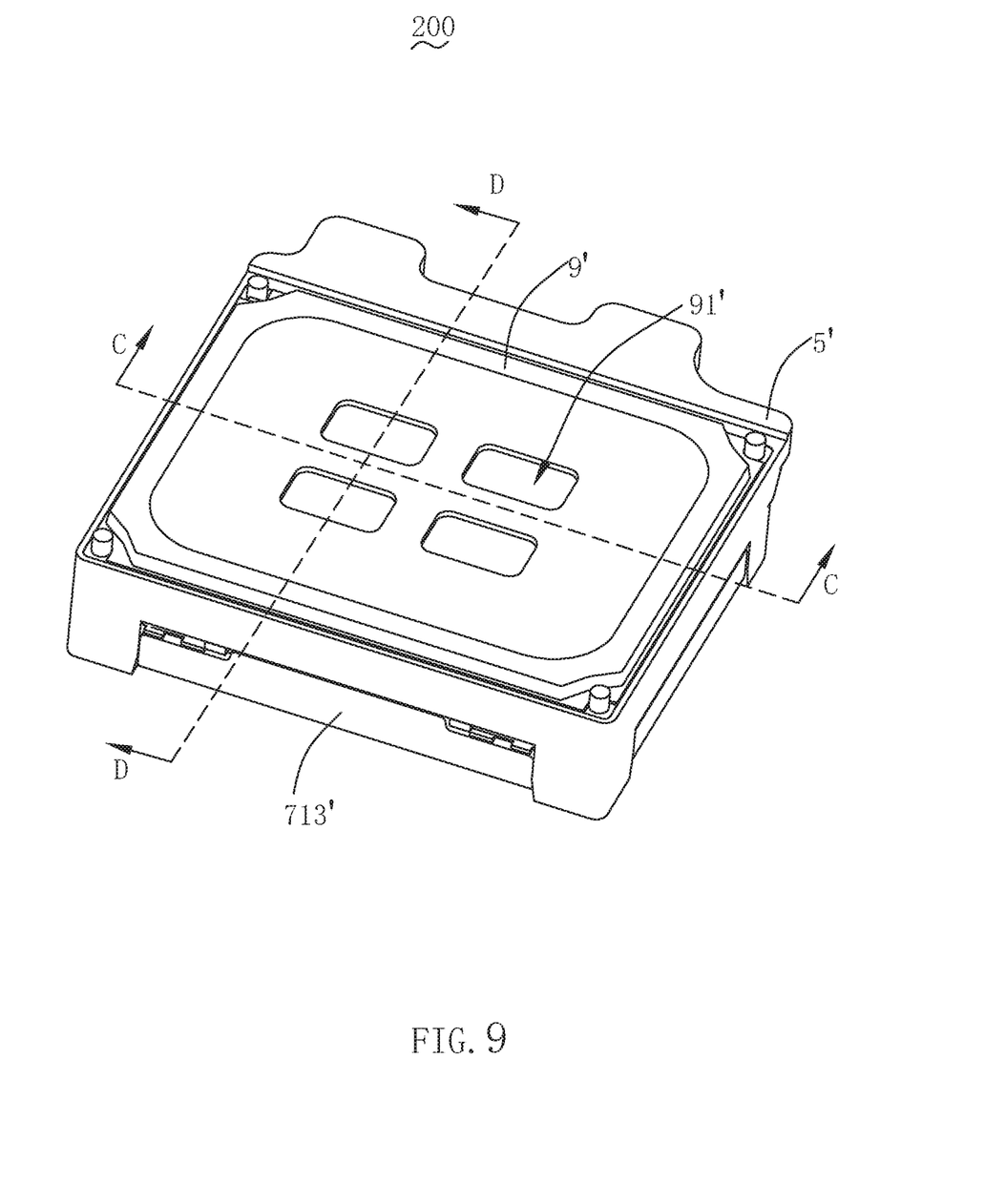
FIG. 9 is a perspective view of the micro-speaker shown in FIG. 8 after being assembled.
Figure 12:
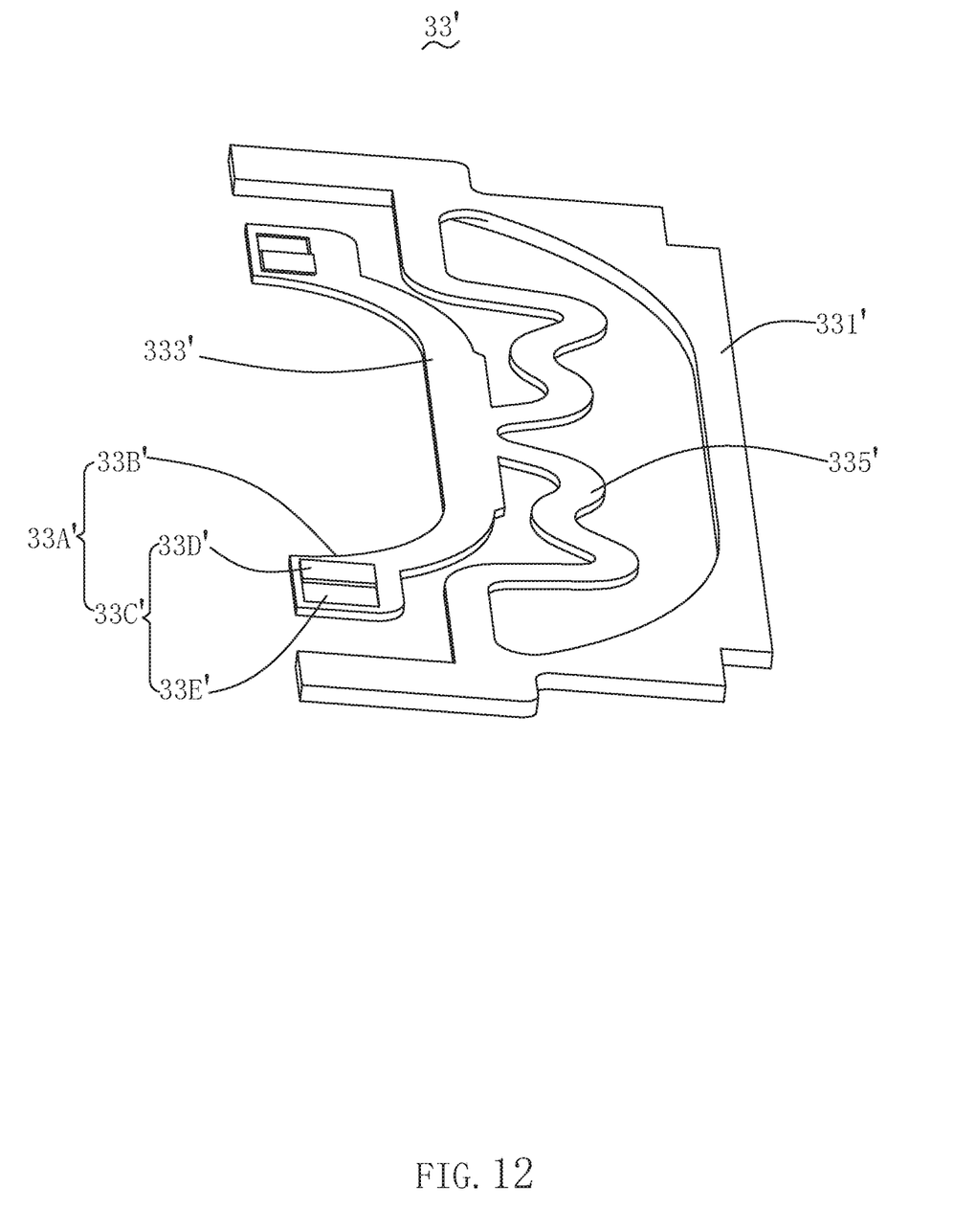
FIG. 12 is a structural schematic diagram of a flexible circuit board in the micro-speaker shown in FIG. 8.

The voice coil 32' includes a body 321' and a lead wire 323' extending from the body 321'. The body 321' includes a pair of long-axis sides 325' and a pair of short-axis sides 327'. Each of the pair of short-axis sides 327' is provided with the flexible circuit board 33'. The flexible circuit board 33' is configured to support the body 321', so that swinging of the body 321' in the long axis direction can be restricted.

One pad 33A' welded to the lead wire 323' is formed on each of the two flexible circuit boards 33'. Alternatively, two pads 33A' welded to the lead wire 323' is formed on one of the two flexible circuit boards 33'. In the present embodiment, two pads 33A' welded to the lead wire 323' is formed on one of the flexible circuit boards 33'.

The pad 33A' includes a base 33B' and a plating layer 33C' formed on the base 33B'. The plating layer 33C' includes a first plating layer 33D' and a second plating layer 33E' extending from the first plating layer 33D'. The first plating layer 33D' has a greater thickness than the second plating layer 33E'. The one end of the lead wire 323' facing away from the body 321' is welded to the pad 33A' and covered by the second plating layer 33E'.

In this embodiment, the first plating layer 33D' is closer to the body 321' than the second plating layer 33E'.

In this embodiment, orthographic projections of the first plating layer 33D' and the second plating layer 33E' on the base 33B' have equal areas.

In this embodiment, the first plating layer 33D' and the second plating layer 33E' are provided at a side of the base 33B' facing the voice coil 32'.

Figure 10:
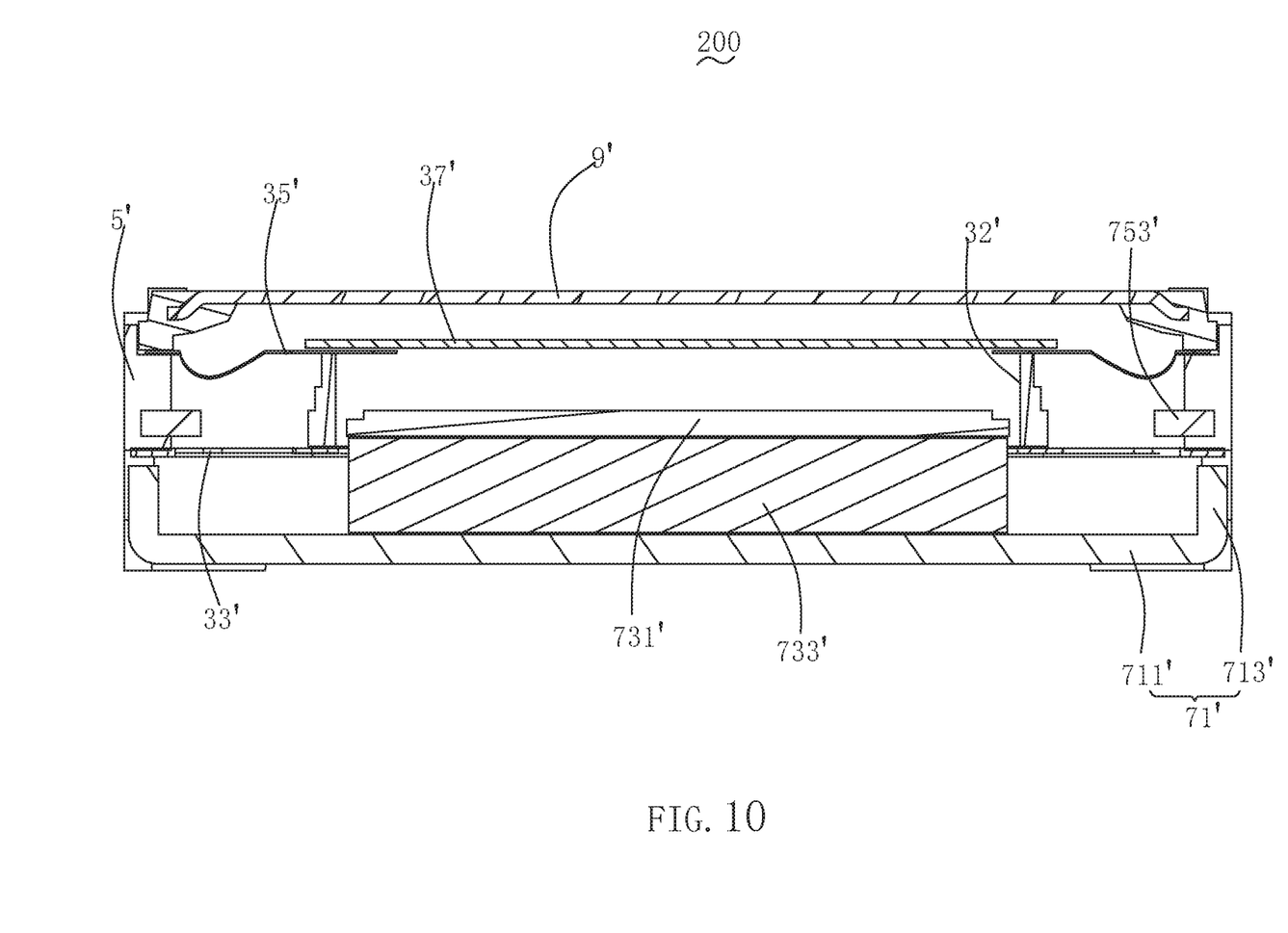
FIG. 10 is a cross-sectional view of the micro-speaker shown in FIG. 9 taken along line C-C.
Figure 11:
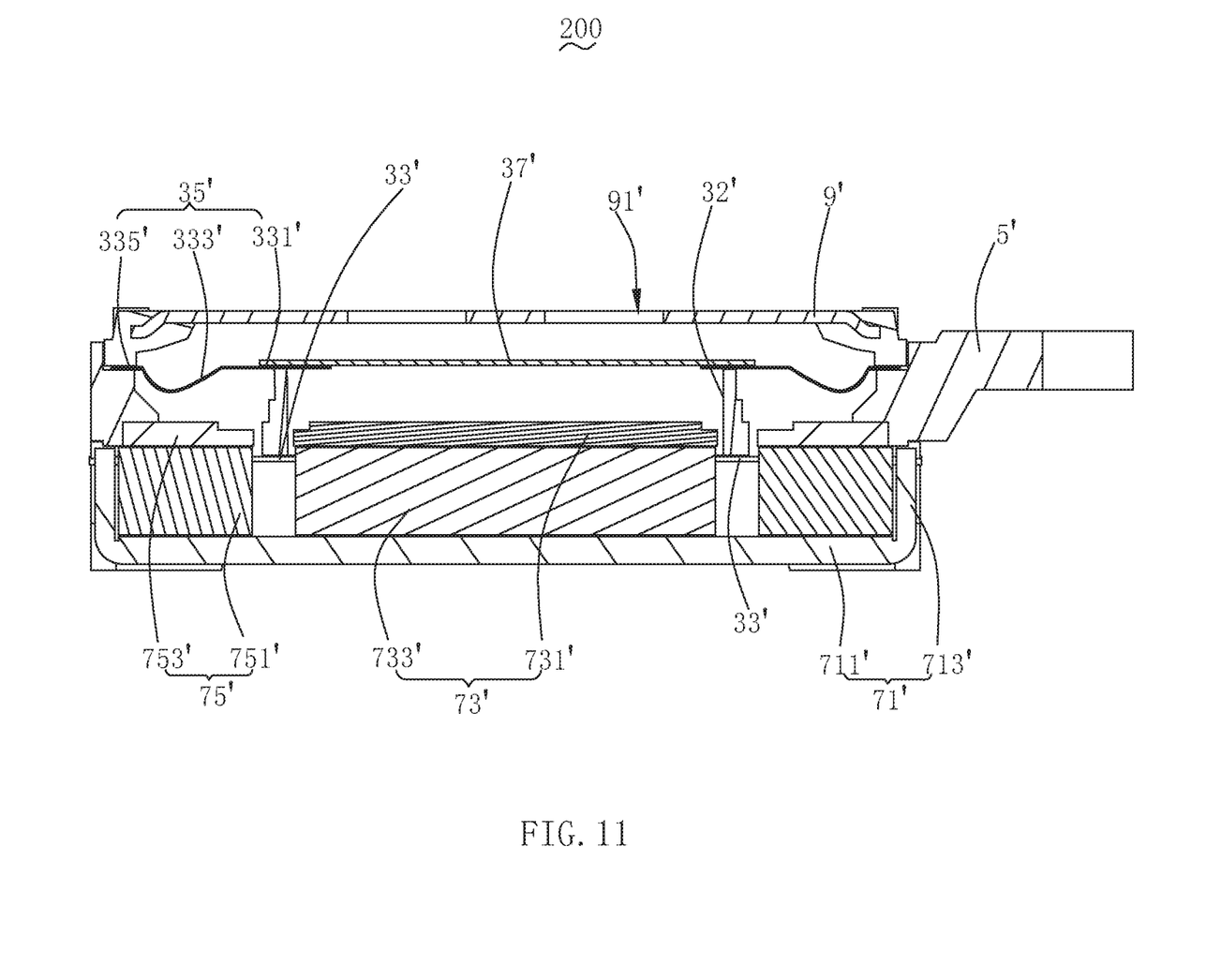
FIG. 11 is a cross-sectional view of the micro-speaker shown in FIG. 9 taken along line D-D.

In this embodiment, the voice coil 32' is located between the flexible circuit board 33' and the diaphragm 31'.

In this embodiment, the flexible circuit board 33' is sandwiched between the voice coil 32' and the diaphragm 31'. After the voice coil 32' is energized, the flexible circuit board 33' vibrates together with the voice coil 32'. In one embodiment, the flexible circuit board 33' is sandwiched between the body 321' of the voice coil 32' and the diaphragm 31'. In other embodiments of the vibration unit 3', the vibration unit 3' may further include a lower diaphragm. The lower diaphragm is bonded to a side of the flexible circuit board 33' facing away from the voice coil 32'. Alternatively, the lower diaphragm is sandwiched between the flexible circuit board 33' and the voice coil 32'. After the voice coil 32' is energized, the lower diaphragm and the flexible circuit board 33' vibrate together with the voice coil 32', so that the sound emission effect can be enhanced.

The flexible circuit board 33' includes a first fixed portion 331' fixed to the holder 5' of the fixed unit 1', a second fixed portion 333' connected to the body 321', and an elastic connection portion 335' connecting the first fixed portion 331' with the second fixed portion 333'. The pad 33A' are formed on the second fixed portion 333'.

The pad 33A' extends from the second fixed portion 333' in a direction facing away from the body 321'.

The diaphragm 31' includes a voice membrane 35' and a dome 37' fixed to the side of the voice membrane 35' facing away from the voice coil 32'.

The voice membrane 35' includes a flat portion 351', a suspension portion 353' extending outward from the flat portion 351', and a joint portion 355' surrounding the suspension portion 353'. The flat portion 351' is sandwiched between the body 321' of the voice coil 32' and the dome 37'. The joint portion 355' is fixed to the side of the holder 5' facing away from the flexible circuit board 33'. As shown in FIG. 8, the flat portion 351 has a center-cut hole 357. The dome 37 covers the center-cut hole 357'. Of course, in other embodiments of the diaphragm 31', the flat portion 351' may not have a center-cut hole, that is, the flat portion 351' is an intact flat plate structure. Alternatively, the dome 37' may be sandwiched between the flat portion 351' and the body 321' of the voice coil 32'. Alternatively, in the case where the flat portion 351' is an intact flat plate structure, the diaphragm 31' may not include a dome. The body 321' of the voice coil 32' is sandwiched between the flat portion 351' and the second fixed portion 333' of the flexible circuit board 33'.

The magnetic circuit unit 7' includes a yoke 71', a first magnet portion 73', and a second magnet portion 75'. The yoke 71' is fixedly held at the holder 5'. The first magnet portion 73' and the second magnet portion 75' are fixed to the yoke 71'. The second magnet portion 75' is provided on both sides of the first magnet portion 73' along the short axis direction and forms a magnetic gap with the first magnet portion 73'. One end of the body 321' of the voice coil 32' is inserted into the magnetic gap, so that the voice coil 32' may vibrate under the action of the magnetic field of the magnetic circuit unit 7' after the voice coil 32' is energized.

The yoke 71' includes a bottom plate 711' and side plates 713' formed by bending from four sides of the bottom plate 711' towards the diaphragm 31'. The first magnet portion 73' and the second magnet portion 75' are fixed to the bottom plate 711'. The side plate 713' is fixed to the holder 5'.

The first magnet portion 73' faces right towards the diaphragm 31'. The first magnet portion 73' includes a pole plate 731' and a main magnet 733'. The pole plate 731' faces right towards the diaphragm 31'. The main magnet 733' is sandwiched between the pole plate 731' and the bottom plate 711' of the yoke 71'.

The second magnet portion 75' includes an auxiliary magnet 751' and a splint 753'. The auxiliary magnet 751' is fixed to the bottom plate 711' and surrounds the main magnet 733'. The splint 753' is fixedly held at the holder 5' and is stacked on the auxiliary magnet 751'. The splint 753' is made of a permeability material. The splint 753' has a through hole. The pole plate 731' is located in the through hole of the splint 753' and is in a same plane as the splint 753'.

The micro-speaker 200 further includes a cover 9' covering the holder 5'. The cover 9' is provided with a voice outlet 91'. The voice outlet 91' is used as a channel for outputting the sound generated by vibration of the diaphragm 31'.

With the micro-speaker 100 provided by the present disclosure, the pad of the flexible circuit board 33 is configured to include a base and a plating layer formed on the base. The plating layer includes a first plating layer and a second plating layer extending from the first plating layer. The second plating layer has a greater thickness than the first plating layer. The end of the lead wire facing away from the body is welded to the pad and covered by the second plating layer. Therefore, when the lead wire is welded to the pad, an insulation layer of the lead wire may be easily penetrated, and the plating layer can better cover the penetrated area of the lead wire, thereby avoiding the risk of pseudo welding of the voice coil.

The above are only preferred embodiments of the present disclosure. Here, it should be noted that those skilled in the art can make modifications without departing from the inventive concept of the present disclosure, but these shall fall into the protection scope of the present disclosure.

What is claimed is:

1. A micro-speaker, comprising:
a vibration unit; and
a fixed unit,
wherein the vibration unit comprises:
a diaphragm;
a voice coil located below the diaphragm and configured to drive the diaphragm to vibrate and emit sound; and
a flexible circuit board connected to the voice coil,
wherein the diaphragm and the flexible circuit board are fixed to the fixed unit, and the voice coil comprises a body and a lead wire extending from the body,
wherein a pad is formed on the flexible circuit board, the pad comprises a base and a plating layer formed on the base, the plating layer comprises a first plating layer and a second plating layer extending from the first plating layer, the first plating layer has a greater thickness than the second plating layer, an end of the lead wire away from the body is welded to the pad and covered by the second plating layer,
wherein the flexible circuit board is sandwiched between the voice coil and the diaphragm,
wherein the flexible circuit board comprises:
a first fixed portion fixed to the fixed unit;
a second fixed portion connected to the body; and
an elastic connection portion connecting the first fixed portion with the second fixed portion,
wherein the pad is formed on the second fixed portion, and
wherein each of the first fixed portion and the second fixed portion are in a ring structure, and the pad is located on a short axis side of the second fixed portion.

2. The micro-speaker as described in claim 1, wherein the first plating layer is closer to the body than the second plating layer.

3. The micro-speaker as described in claim 1, wherein orthographic projections of the first plating layer and the second plating layer on the base have equal areas.

4. The micro-speaker as described in claim 1, wherein the first plating layer and the second plating layer are provided at a side of the base facing the voice coil.

5. The micro-speaker as described in claim 1, wherein the fixed unit comprises a magnetic circuit unit and a holder having a receiving space and, the magnetic circuit unit and the vibration unit are received in the holder, the magnetic circuit unit comprises a yoke and a first magnet portion fixed to the yoke, the voice coil is wound around an outer circumference of the first magnet portion, the pad extends from the second fixed portion in a direction facing away from the first fixed portion, and the first magnet portion is recessed to form an avoiding portion corresponding to the pad.

* * * * *